United States Patent
Lee et al.

(10) Patent No.: US 8,907,834 B2
(45) Date of Patent: Dec. 9, 2014

(54) APPARATUS AND METHODS FOR CONVERTING ANALOG SIGNAL TO N-BIT DIGITAL DATA

(71) Applicant: Samsung Electronics Co., Ltd., Suwon-si, Gyeonggi-do (KR)

(72) Inventors: Choong-Hoon Lee, Seoul (KR); Michael Choi, Seoul (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/101,747

(22) Filed: Dec. 10, 2013

(65) Prior Publication Data

US 2014/0184436 A1  Jul. 3, 2014

(30) Foreign Application Priority Data

Dec. 27, 2012  (KR) .................. 10-2012-0154188

(51) Int. Cl.
*H03M 1/38* (2006.01)
*H03M 1/12* (2006.01)
*H03M 1/00* (2006.01)
*H03M 1/06* (2006.01)

(52) U.S. Cl.
CPC . *H03M 1/38* (2013.01); *H03M 1/12* (2013.01); *H03M 1/00* (2013.01); *H03M 1/0695* (2013.01)
USPC .......................................... 341/161; 341/120

(58) Field of Classification Search
CPC ....... H03M 1/38; H03M 1/0695; H03M 1/12; H03M 1/00
USPC .......... 341/161, 120, 118, 155, 156, 110, 172
See application file for complete search history.

(56) References Cited

U.S. PATENT DOCUMENTS

| | | | |
|---|---|---|---|
| 8,446,304 B2 * | 5/2013 | Scanlan | ....... 341/120 |
| 2011/0057823 A1 | 3/2011 | Harpe | |
| 2012/0001781 A1 | 1/2012 | Scanlan | |

* cited by examiner

*Primary Examiner* — Joseph Lauture
(74) *Attorney, Agent, or Firm* — F. Chau & Associates, LLC

(57) ABSTRACT

An apparatus includes a sample holding circuit, a comparator, a digital-to-analog converter, a clock generator, a successive approximation logic circuit, and a background calibration circuit. The apparatus converts an analog signal into digital data based on an asynchronous clock signal. The clock signal follows the number of clocks in a converting operation section through a background calibration scheme.

20 Claims, 12 Drawing Sheets

APPARATUS AND METHODS FOR CONVERTING ANALOG SIGNAL TO N-BIT DIGITAL DATA

CROSS-REFERENCE TO RELATED APPLICATION

This application claims priority to 35 USC §119 to Korean Patent Application No. 10-2012-0154188, filed on Dec. 27, 2012, in the Korean Intellectual Property Office (KIPO), the disclosure of which is incorporated by reference in its entirety herein.

BACKGROUND

1. Technical Field

Exemplary embodiments of the inventive concept relate generally to a successive approximation register analog-digital converter (SAR ADC), more particularly to an apparatus and a method for converting an analog signal into n-bit digital data in which a more exact clock period can be implemented.

2. Discussion of Related Art

An Analog-to-Digital Converter (ADC) is a device for converting an analog signal to a digital code or digital signal. The ADC samples the analog signal to convert the analog signal into the digital code or digital signal corresponding to a magnitude of the analog signal.

A Successive Approximation Register ADC (SAR ADC) is a type of ADC that combines digital codes with each other while sequentially increasing or decreasing the digital codes from the most significant bit and compares the digital codes with an analog signal, so that a digital code is approximated to the analog input signal.

In a general SAR ADC, a clock signal required for a binary searching operation section is received from a source outside the ADC. In an asynchronous SAR ADC, a clock signal for the binary searching operation section is generated inside the ADC.

However, when the clock signal generated from inside the asynchronous SAR ADC, it is difficult to implement an exact clock period required for the binary searching operation section of the SAR ADC.

SUMMARY

At least one exemplary embodiment of the inventive concept provides an analog-to-digital converting apparatus which can exactly follow the number of clocks in a converting operation section through a background calibration scheme and a method thereof.

According to an exemplary embodiment of the inventive concept, an apparatus for converting an analog signal into multi-bit digital data is provided. The apparatus includes a sample holding circuit configured to sample and hold the analog signal; a comparator configured to compare the sampled and held analog signal with an analog reference signal in response to a clock signal; a digital-to-analog converter configured to convert the multi-bit digital data into the analog reference signal and provide the analog reference signal to the comparator; a clock generator configured to generate the clock signal in response to an operation state of the comparator and configured to control a period of the clock signal according to a delay time varied by a control signal; a successive approximation logic circuit configured to successively search for a binary signal that is approximated to an output signal of the comparator from a most significant bit to a least significant bit of the binary signal in response to the clock signal and configured to provide the multi-bit digital data resulting from the search to the digital-to-analog converter; and a background calibration circuit configured to sense a cycle number of the clock signal used in the comparator and the successive approximation logic circuit at a conversion completion time point and configured to generate the control signal such that a next cycle number of the clock signal to be used for a subsequently converting operation cycle follows an N-th clock cycle of the clock signal.

The clock generator may include an input unit configured to generate an operation state signal in response to the output signal of the comparator; a delay block configured to delay the operation state signal in response to the control signal from the background calibration circuit; and an output unit configured to output a signal delayed through the delay block as the clock signal, in response to a conversion start signal.

The control signal may include a fine control signal and a coarse control signal, and the delay block may include a fine tuning circuit operating in response to the fine control signal and a coarse tuning circuit operating in response to the coarse control signal.

The fine tuning circuit may include two complementary metal-oxide semiconductor (CMOS) inverters cascade-coupled between the input unit and the coarse tuning circuit; and two variable current sources serially connected to each drain current path of the two CMOS invertors, the two variable current sources having set current values that are varied in response to the fine control signal.

Each of the two variable current sources may include a plurality of fine control switches connected in parallel to each other, the fine control switches configured to be switched selectively in response to the fine control signal; and a plurality of fixed current sources serially connected to each of the fine control switches, the fixed current sources having fixed set current values different from each other.

The coarse tuning circuit may include a plurality of CMOS delay cells of a fixed-current type, the CMOS delay cells cascade-coupled between the fine tuning circuit and the output unit; and a plurality of coarse control switches, each coarse control switch connected between the output unit and an output terminal of each CMOS delay cell, the coarse control switches configured to be switched selectively in response to the coarse control signal.

The background calibration circuit may include a sensing circuit configured to sense the cycle number of the clock signal at the conversion completion time point; a mode determination unit configured to determine a control mode in response to the sensed cycle number; and a control signal generating circuit configured to generate the control signal in response to the determined control mode and the sensed cycle number.

The sensing circuit may include a set unit configured to be set in response to a least significant bit from the successive approximation logic circuit; a sensing signal generating circuit configured to receive a set value of the set unit and configured to generate a plurality of sensing signals corresponding to the cycle number; and a latch circuit configured to lock the clock signal applied to the sensing signal generating circuit at the conversion completion time point.

The mode determination unit may determine a locking mode, a fine control mode or a coarse control mode according to the cycle number of the clock signal, the cycle number corresponding to a combination of the sensing signals, generate a fine clock signal in the fine control mode and generate a coarse clock signal in the coarse control mode.

The control signal generating circuit may include a first bidirectional shift register configured to determine a shift direction in response to the sensing signals and configured to generate a fine control signal which is shifted in the determined shift direction in response to the fine clock signal; and a second bidirectional shift register configured to determine a shift direction in response to the sensing signals and configured to generate a coarse control signal which is shifted in the determined shift direction in response to the coarse clock signal.

According to an exemplary embodiment of the inventive concept, a method of converting an analog signal into multi-bit digital data is provided. The method includes comparing the analog signal with an analog reference signal that is successively varied per period of a clock signal; successively searching for a binary signal that is approximated to a result of the comparing from a most significant bit to a least significant bit of the binary signal to successively generate the N-bit digital data; generating the analog reference signal by converting the multi-bit digital; sensing a cycle number of the clock signal at a conversion completion time point; generating the clock signal in response to the result of the comparing; and controlling a delay time of the clock signal such that a next cycle number of clock signal to be used for a subsequently converting operation cycle follows an N-th clock cycle of the clock signal.

Sensing the cycle number may include setting a set value in response to a least significant resulting from searching for the binary signal; generating a plurality of sensing signals in response to the clock signal and the set value, the sensing signals being set per half period of the clock signal from an (N+1)th clock cycle of the clock signal; and locking the clock signal at the conversion completion time point.

Controlling the delay time may include determining a control mode in response to the sensed cycle number; generating a control signal in response to determined control mode; and changing the delay time of the clock signal in response to the control signal.

Determining the control mode may include determining a locking mode, a fine control mode or a coarse control mode, respectively, according to the cycle number of the clock signal, the cycle number being sensed based on a combination of the sensing signals; generating a fine clock signal in the fine control mode; and generating a coarse clock signal in the coarse control mode.

Generating the control signal may include determining a direction changing the delay time in response to the sensing signals; generating a fine control signal that is shifted in the determined direction in response to the fine clock signal when the sensed cycle number of the clock signal is within a half cycle in comparison with an N-th cycle number of the clock signal; and generating a coarse control signal that is shifted in the determined direction in response to the coarse clock signal when the sensed cycle number of the clock signal is outside of the half cycle in comparison with N-th cycle number.

According to an exemplary embodiment of the inventive concept, an apparatus for converting an analog signal into multi-bit digital data is provided. The apparatus includes a comparator, a digital-to-analog converter (DAC), a clock generator, a successive approximation logic circuit, and a background calibration circuit. The comparator compares the analog signal with an analog reference signal in response to a clock signal. The DAC converts the multi-bit digital data into the analog reference signal and provides the analog reference signal to the comparator. The clock generator controls a period of the clock signal according to a delay time varied by a control signal. The successive approximation logic circuit performs a conversion operation on an output signal of the comparator in response to the clock signal to generate the multi-bit digital signal and provides the multi-bit digital signal to the DAC. The background calibration circuit determines a number of clock cycles of the clock signal taken to perform the operation based on a LSB of a signal generated by the logic circuit during the operation, and generates the control signal based on the determined number.

The successive approximation logic circuit may be a successive approximation register analog-to-digital converter. The background calibration circuit may determine the number of clock cycles based on the LSB, the clock signal, and a signal indicating the conversion has completed. The calibration circuit may maintain the delay time when the determined number is a sum of a predetermined integer plus 0.5, decrease the delay time when the determined number is less than the sum, and may increase the delay time when the determined number is greater than the sum. The background calibration circuit may decrease the delay time a first value when the sum is less than the integer and otherwise increase the delay time a second value smaller than the first value. The background calibration circuit may increase the delay time a third value when the sum is greater than a sum of the integer and one and otherwise increase the delay time a fourth value smaller than the third value.

According to at least one exemplary embodiment of the inventive concept, the analog-to-digital converting apparatus using the background calibration scheme can automatically correct a delay time to allow the number of clocks to follow N in a subsequent conversion operation by sensing the number of clocks at a conversion completion time point, so that N cycles of the clock signal can be provided regardless of any variation in a process, temperature or a power source voltage.

BRIEF DESCRIPTION OF THE DRAWINGS

Illustrative, exemplary embodiments of the inventive concept will be more clearly understood from the following detailed description taken in conjunction with the accompanying drawings.

DETAILED DESCRIPTION

Figure 1:
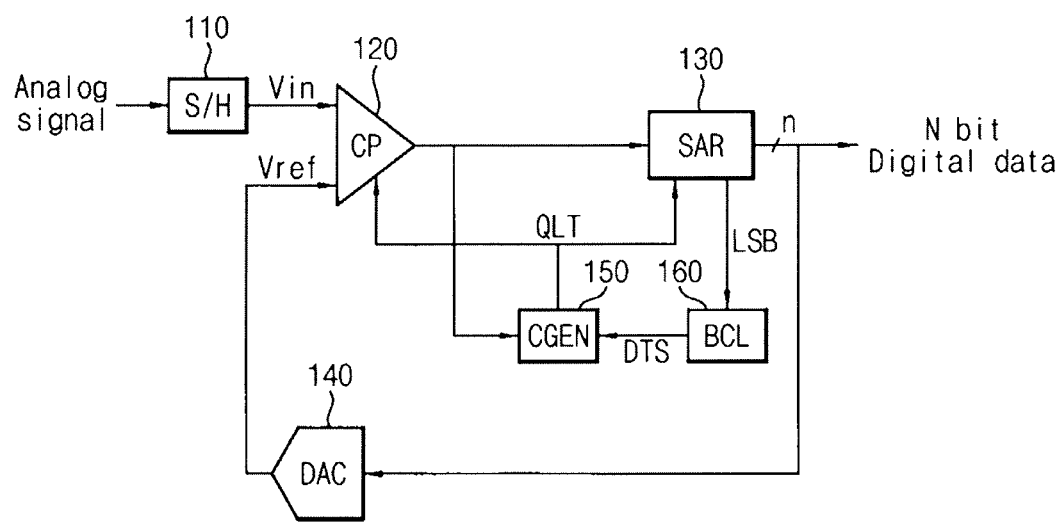
FIG. 1 is a block diagram showing an SAR ADC according to an exemplary embodiment of the inventive concept.

The inventive concept will be described more fully hereinafter with reference to the accompanying drawings, in which some exemplary embodiments thereof are shown. The present inventive concept may, however, be embodied in many different forms and should not be construed as limited to the exemplary embodiments set forth herein. In the drawings, the sizes and relative sizes of layers and regions may be exaggerated for clarity. Like numerals refer to like elements throughout.

It will be understood that when an element is referred to as being "connected" or "coupled" to another element, it can be directly connected or coupled to the other element or intervening elements may be present. As used herein, the singular forms "a," "an" and "the" are intended to include the plural forms as well, unless the context clearly indicates otherwise.

It should also be noted that in some alternative implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

FIG. 1 is a block diagram showing an SAR ADC according to an exemplary embodiment of the inventive concept.

Referring to FIG. 1, the SAR ADC 100 includes a sample holding circuit 110, a comparator 120, a successive approximation logic circuit 130, a Digital-to-Analog (DA) converter 140, a clock generator 150 and a background calibration circuit 160.

The sample holding circuit 110 samples and holds an input signal Vin in response to a sampling clock when an analog signal is input. For example, if the period of the sampling clock is 100 ms and the duty ratio of the sampling clock is 50%, the sampling holding circuit 100 would sample and hold the input signal during a first 50 ms, and then the next sample and hold would occur after another 50 ms has elapsed. However, the inventive concept is not limited to a sampling clock having any particular period or duty cycle.

The comparator 120 outputs a comparison result between the input signal Vin and a reference signal Vref in response to a clock signal QLT received from the clock generator 150. For example, the comparator 120 may output the comparison result when the clock signal QLT is at an active phase (e.g., a high level state) and maintain a reset state when the clock signal QLT is at an inactive phase (e.g., a low level state). In an exemplary embodiment, the comparator 120 outputs positive and negative outputs VCP and VCN that are high when the clock signal QLT is at the inactive phase. If the input signal Vin is equal to or greater than the reference voltage Vref at the active phase, the comparator 120 outputs a signal having a first logic level (e.g., a high level or a logic 1). If the input signal Vin is less than the reference voltage Vref at the active phase, the comparator 120 outputs a signal having a second logic level (e.g., a low level or a logic 0).

In an exemplary embodiment, the successive approximation logic circuit 130 includes shift registers, a combination circuit and a Successive Approximation Register (SAR). The successive approximation logic circuit 130 initiates a conversion operation in response to the conversion start signal QST, allows the most significant bit of the n-bit digital data to be set to logic "1" and the other bits to be set to logic "0" while being shifted according to an asynchronous clock signal QLT, and provides them to the digital-to-analog convertor 140. Then, if the output of the comparator 120 is "0", the value of the most significant bit is converted from "1" to "0", and then, the bit value is set to "1". To the contrary, if the output of the comparator 120 is "1", the value of the most significant bit is maintained at "1" and then, the bit value is set to "1". This operation is continuously repeated so that N-bit digital data is output. Therefore, the successive approximation logic circuit 130 converts the output signal LSB of the $N^{TH}$ register of the shift registers from a low state to a high state in response to the $N^{TH}$ clock cycle of the clock signal.

The DAC converter 140 converts N-bit digital data provided from the successive approximation logic circuit 130 into an analog signal and provides the analog signal to the comparator 120 as the reference signal Vref.

The clock generator 150 generates a clock signal QLT, a delay time of which is controlled in response to a control signal DTS provided from the background calibration circuit 160.

The background calibration circuit 160 senses the number of operation cycles by inputting an LSB signal of the successive approximation logic circuit 130 during the conversion operation section and generates the control signal DTS which allows the number of the sensed cycles to follow the N (e.g., follow the N-th clock cycle of the clock signal).

Figure 2:
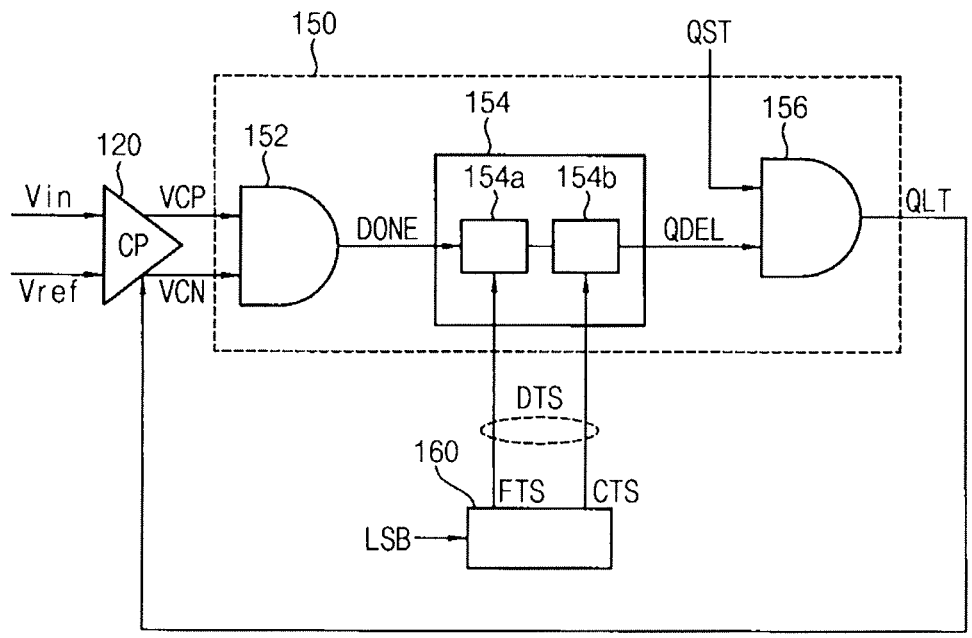
FIG. 2 is a circuit diagram showing the clock generator in FIG. 1 according to an exemplary embodiment of the inventive concept.
Figure 3:
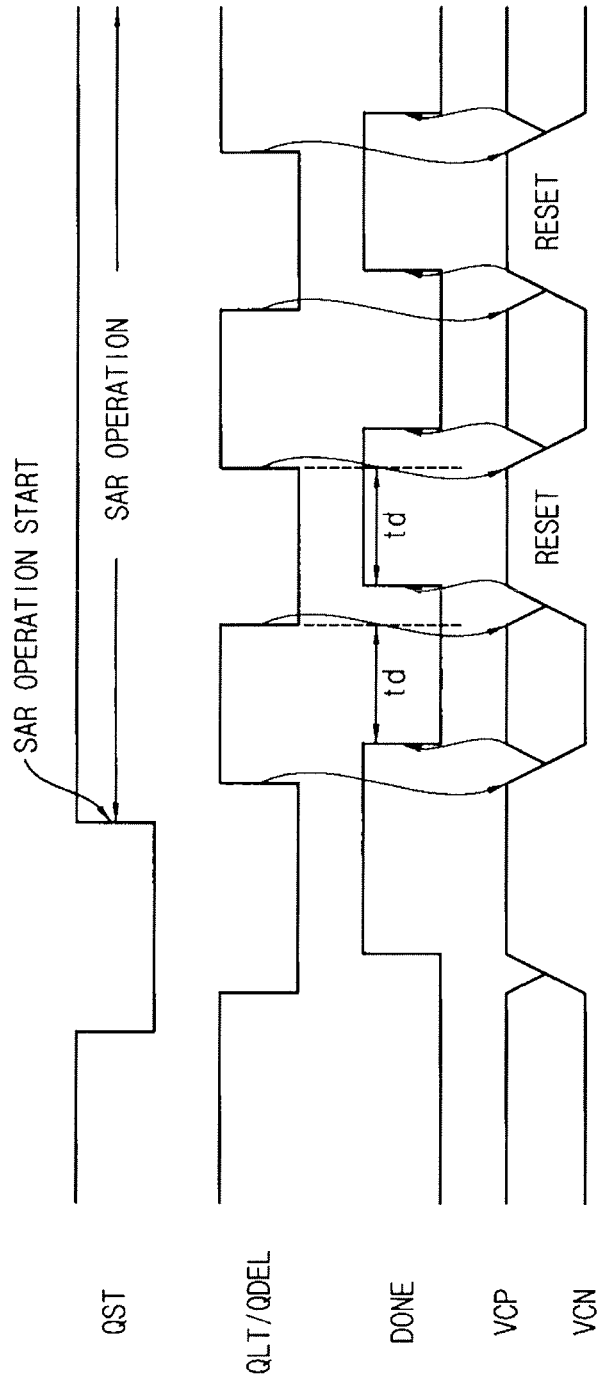
FIG. 3 is a timing diagram illustrating an exemplary operation of the circuit in FIG. 2.

FIG. 2 is a circuit diagram showing the clock generator 150 in FIG. 1. FIG. 3 is a timing diagram illustrating an exemplary operation of the circuit in FIG. 2.

Referring to FIG. 2, the clock generator 150 includes an input unit 152, a delay block 154, and an output unit 156.

The input unit 152 generates an operation state signal DONE when the positive output signal VCP and the negative output signal VCN of the comparator 150 is input to the input unit 152. For example, the input unit 152 may include an AND gate. When the two input signals are in a high level state, that is, logic "1", the AND gate outputs logic "1" as the operation state signal DONE.

The delay block 154 includes a fine tuning circuit 154a and a coarse tuning circuit 154b. The delay block 154 delays the operation state signal for a predetermined time in response to the control signal DTS so that a delayed signal QDEL is output. The control signal DTS includes a fine control signal FTS and a coarse control signal CTS. The fine tuning circuit 154a determines a fine delay time in response to the fine control signal FTS and the coarse tuning circuit 154b determines a coarse delay time in response to the coarse control signal CTS. In an exemplary embodiment, the coarse delay time is greater or significantly greater than the fine delay time.

The output unit 156 outputs a delay signal QDEL in response to a conversion start signal QST. For example, the output unit 156 may include an AND gate. The AND gate allows the delay signal QDEL to pass therethrough when the conversion start signal QST is in a high level state.

Therefore, as shown in FIG. 3, after the clock signal QLT is delayed for a predetermined time in response to an active operation of the comparator 120, the clock signal QLT becomes inactive in a low level state and an output state of the comparator 120 is reset in response to the inactive state of the clock signal QLT. Thus, after the clock signal QLT is delayed for a predetermined time in response to an inactive operation of the comparator 120, the clock signal QLT becomes active in a high level state.

Therefore, when the delay property of the delay block 154 is varied under the influence of a process variable, a temperature variation or a power source voltage variation, an N cycle number of an asynchronous clock signal cannot be exactly generated. Thus, even though the delay property is varied under the influence of a process variable, a temperature variation or a power source voltage variation, the delay time must be adaptively adjusted such that the N cycle number of the asynchronous clock signal is exactly generated.

According to an exemplary embodiment of the inventive concept, a background calibration scheme replaces a scheme of controlling a delay time through an external register control before an ADC operation. The background calibration scheme refers to a technique that continuously performs a correction such that a desired performance is maintained by continuously sensing an IP performance during an IP operation. In an exemplary embodiment, the cycle number of an asynchronous clock signal is maintained through a continuous correction by sensing the cycle number of the asynchronous clock signal.

Thus, in order to apply the background calibration scheme in an exemplary embodiment, a circuitry configuration of the delay block 154 of the clock generator 150 is changed into a variable control scheme and the background calibration circuit 160 is further added.

Figure 4:
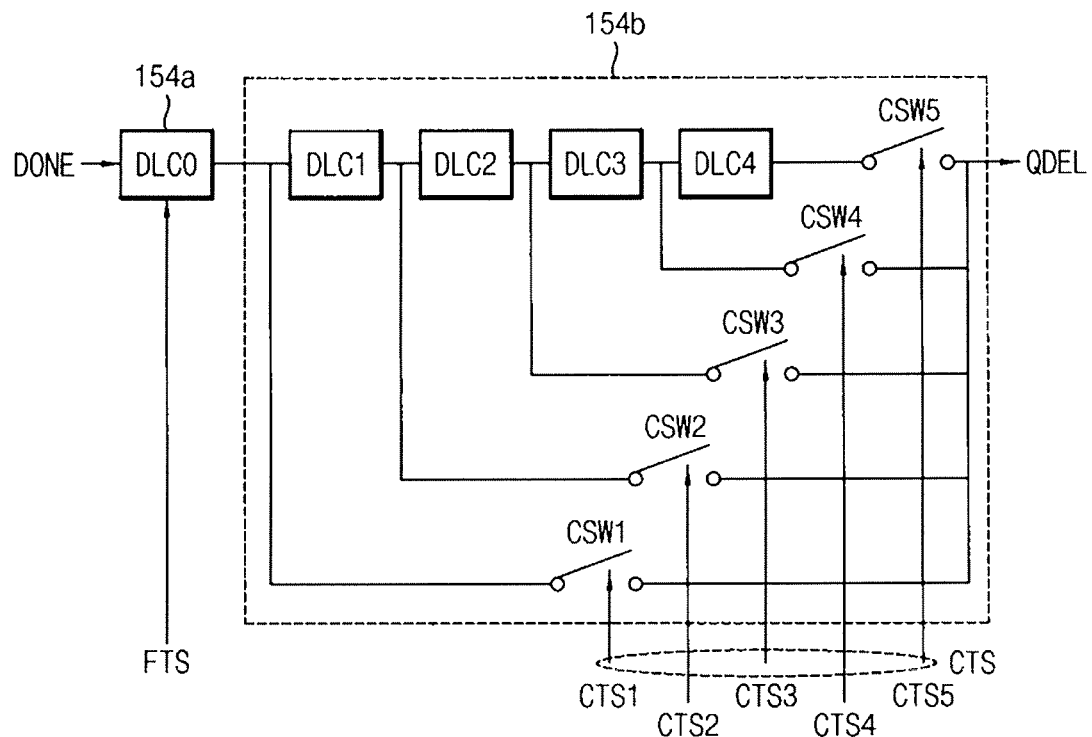
FIG. 4 is a circuit diagram showing a delay block in FIG. 2 according to an exemplary embodiment of the inventive concept.

FIG. 4 is a circuit diagram showing a delay block in FIG. 2 according to an exemplary embodiment of the inventive concept.

Referring to FIG. 4, the delay block 154 includes a fine tuning circuit 154a and a coarse tuning circuit 154b. The coarse tuning circuit 154b includes a plurality of fixed current type CMOS delay cells and a plurality of coarse control switches. For example, the fixed current type CMOS delay cells include four delay cells DLC1 to DLC4, and the coarse control switches includes five switches CSW1 to CSW5. The four delay cells DLC1 to DLC4 are cascaded to each other.

The switch CSW1 allows the fine tuning circuit 154a, that is, the delay cell DLC0 to be directly connected to an output terminal in response to the coarse control signal CTS1. The switch CSW2 allows the delay cell DLC1 to be directly connected to the output terminal in response to the coarse control signal CTS2. The switch CSW3 allows the delay cell DLC2 to be directly connected to the output terminal in response to the coarse control signal CTS3. The switch CSW4 allows the delay cell DLC3 to be directly connected to the output terminal in response to the coarse control signal CTS4. The switch CSW5 allows the delay cell DLC4 to be directly connected to the output terminal in response to the coarse control signal CTS5.

If each delay time of the delay cells DLC0 to DLC4 is 10 units of time (e.g., ms, ns, etc.), when the switch CSW1 is turned on, the delay time is 10 units of time by the delay cell DLC0. If the switch CSW2 is turned on, the delay time becomes 20 units of time due to the cascade connection of the delay cells DLC0 and DLC1. If the switch CSW3 is turned on, the delay time becomes 30 units of time due to the cascade connection of the delay cells DLC0 to DLC2. If the switch CSW4 is turned on, the delay time becomes 40 units of time due to the cascade connection of the delay cells DLC0 to DLC3. If the switch CSW5 is turned on, the delay time becomes 50 units of time due to the cascade connection of the delay cells DLC0 to DLC4.

Figure 5:
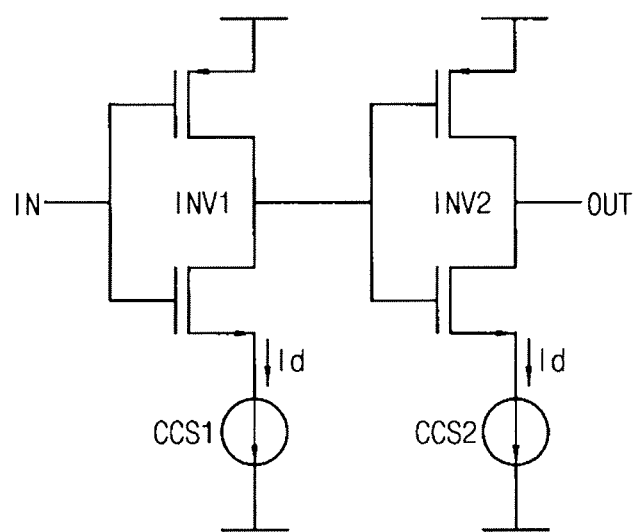
FIG. 5 is a circuit diagram showing each of delay cells of the coarse tuning circuit in FIG. 4 according to an exemplary embodiment of the inventive concept.

FIG. 5 is a circuit diagram showing each of the delay cells DLC1 to DLC4 of the coarse tuning circuit 154b in FIG. 4 according to an exemplary embodiment of the inventive concept.

Referring to FIG. 5, each of the delay cells DLC1 to DLC4 has a structure of cascading CMOS inverters INV1 and INV2 in two stages. The pull-down drain currents Id of the CMOS inverters INV1 and INV2 is fixed due to fixed current sources CCS1 and CCS2 in order to minimize influence of external environmental events. Thus, a rising edge of the input signal is delayed due to the pull-down drain current Id of the front end current source CCS1 and a falling edge is delayed due to the pull down drain current Id of the rear end current source CCS2.

Figure 6:
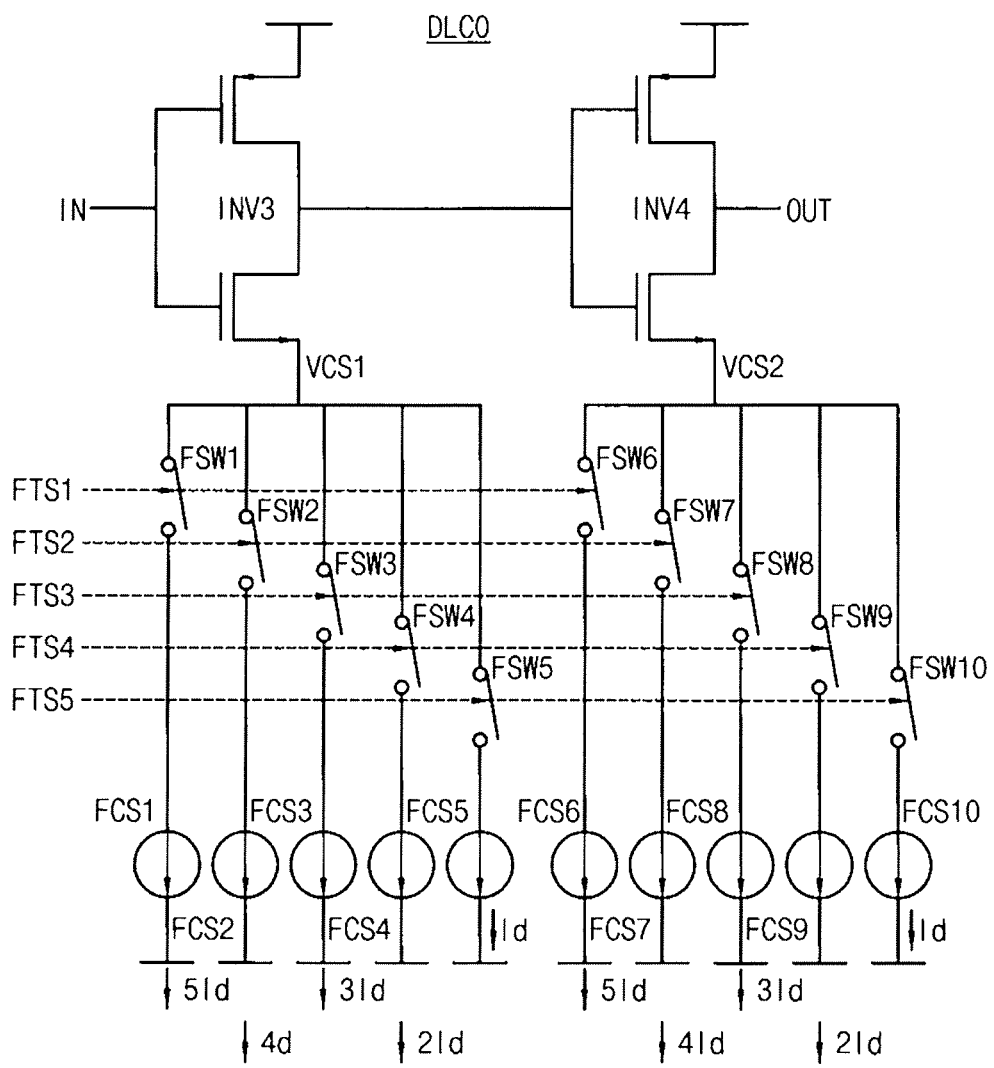
FIG. 6 is a circuit diagram showing the delay cell of the fine tuning circuit in FIG. 4 according to an exemplary embodiment of the inventive concept.

FIG. 6 is a circuit diagram showing the delay cell of the fine tuning circuit in FIG. 4 according to an exemplary embodiment of the inventive concept.

Referring to FIG. 6, the delay cell DLC0 has a structure of cascading CMOS inverters INV3 and INV4 in two stages. The pull-down drain of the CMOS inverters INV3 and INV4 is connected in serial to variable current sources VCS1 and VCS2, respectively. Each of the variable current sources VCS1 and VCS2 includes a plurality of fine control switches such as five switches FSW1 to FSW5 or FSW6 to FSW10 and a plurality of fixed current sources such as five fixed current sources FCS1 to FCS5 or FCS6 to FCS10.

The switch FSW1 or FSW6 allows the fixed current source FCS1 or FCS6 to be connected to the inverter INV3 or INV4 in response to the fine control signal FTS1. The switch FSW2 or FSW7 allows the fixed current source FCS2 or FCS7 to be connected to the inverter INV3 or INV4 in response to the fine control signal FTS2. The switch FSW3 or FSW8 allows the fixed current source FCS3 or FCS8 to be connected to the inverter INV3 or INV4 in response to the fine control signal FTS3. The switch FSW4 or FSW9 allows the fixed current source FCS4 or FCS9 to be connected to the inverter INV3 or INV4 in response to the fine control signal FTS4. The switch FSW5 or FSW10 allows the fixed current source FCS5 or FCS10 to be connected to the inverter INV3 or INV4 in response to the fine control signal FTS5.

For example, the current of the fixed current source FCS1 or FCS6 is 5Id. The current of the fixed current source FCS2 or FCS7 is 4Id. The current of the fixed current source FCS3 or FCS8 is 3Id. The current of the fixed current source FCS4 or FCS9 is 2Id. The current of the fixed current source FCS5 or FCS10 is Id.

Therefore, if the switches FSW1 and FSW6 are turned on, the delay time corresponding to the current 5Id is selected. If the switches FSW2 and FSW7 are turned on, the delay time corresponding to the current 4Id is selected. If the switches FSW3 and FSW8 are turned on, the delay time corresponding to the current 3Id is selected. If the switches FSW4 and FSW8 are turned on, the delay time corresponding to the current 2Id is selected. If the switches FSW5 and FSW10 are turned on, the delay time corresponding to the current Id is selected. Thus, if it is assumed that each of the delay cells DLC1 to DLC4 is 10, the fine tuning circuit 154a may be controlled through the switching control such that the delay time becomes 2, 4, 6, 8 or 10.

Figure 7:
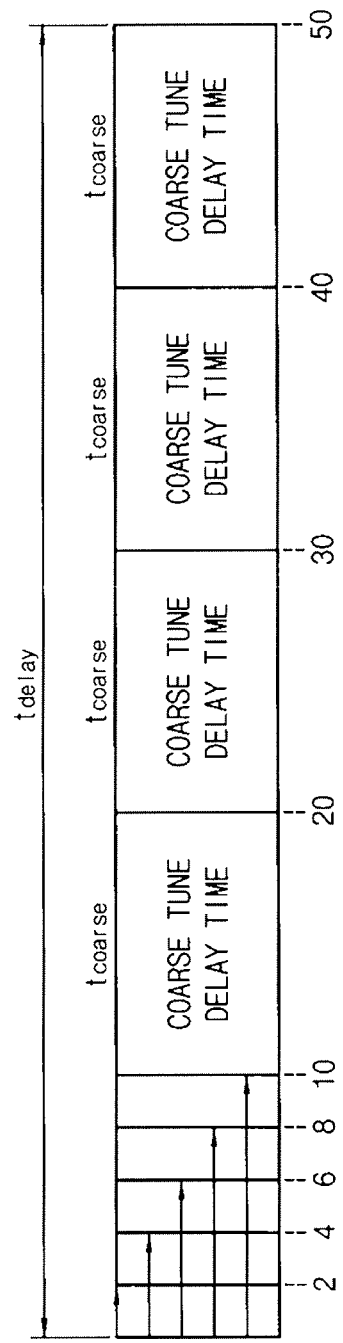
FIG. 7 is a view illustrating a controllable delay time in the delay block in FIG. 4.

FIG. 7 is a view illustrating a controllable delay time in the delay block 154 in FIG. 4.

Referring to FIG. 7, the delay time of the delay block 154, which is controllable, may be controlled in the range of 2 units of time to 50 units of time through the combination of the fine control signal FTS and the coarse control signal CTS. For example, if the center value 26 is given as an initial value, the initial value 26 of the delay time may be decreased or increased by units of 2 through the fine control so that the delay time becomes 24, 22, etc., or 28, 30, etc. In addition, the initial value 26 of the delay time may be decreased or increased by units of 10 through the coarse control so that the delay time becomes 16, 6, etc., or 36, 46, etc.

Figure 8:
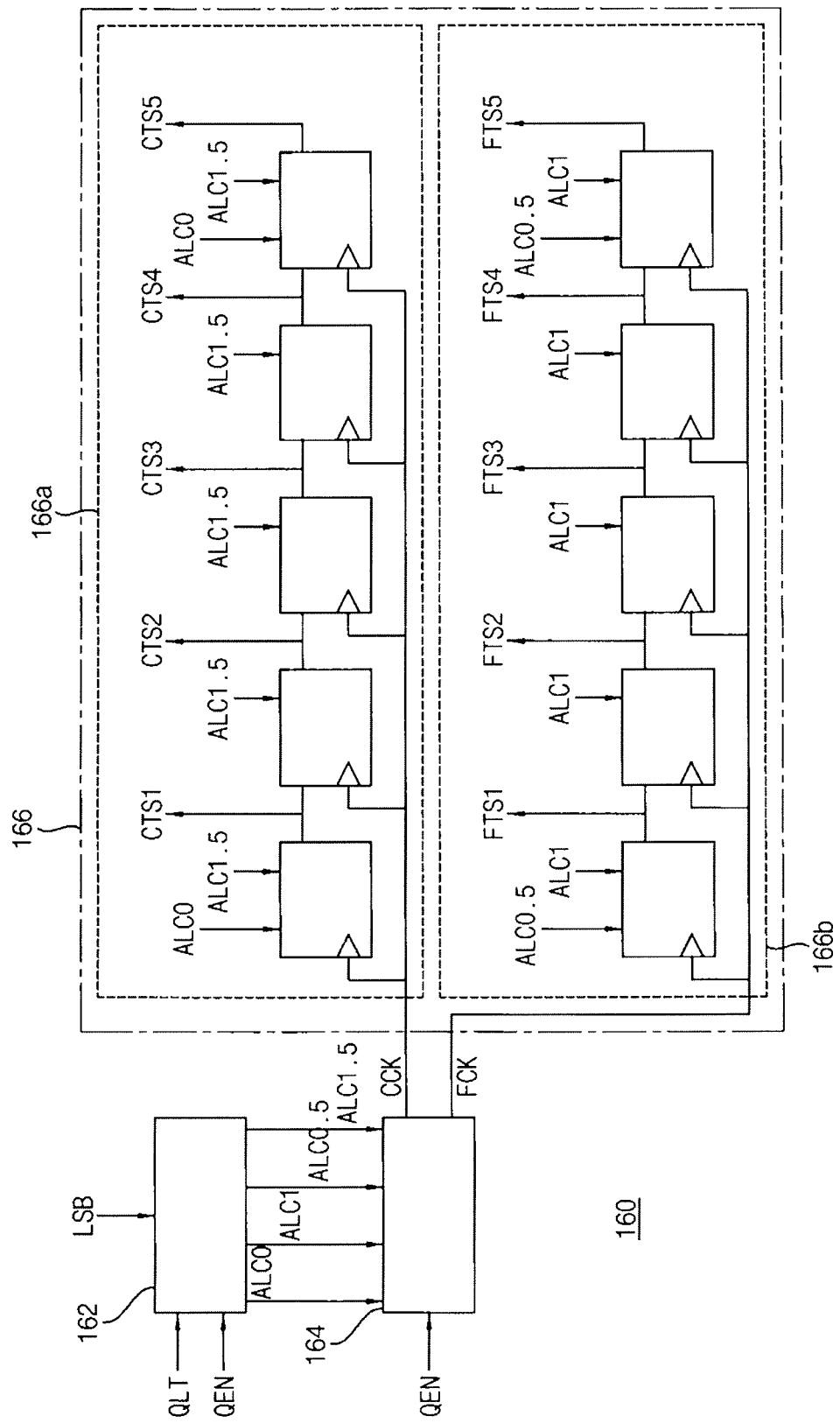
FIG. 8 is a block diagram showing the background calibration circuit in FIG. 2 according to an exemplary embodiment of the inventive concept.

FIG. 8 is a block diagram showing the background calibration circuit 160 in FIG. 2 according to an exemplary embodiment of the inventive concept.

Referring to FIG. 8, the background calibration circuit includes a sensing circuit 162, a mode determination unit 164 and a control signal generating circuit 166.

The sensing circuit 162 is set to a set value at the $N^{TH}$ clock cycle of the clock signal in response to the LSB signal. The sensing circuit 162 is synchronized with the $(N+1)^{TH}$ clock cycle of the clock signal and senses the cycle number of the clock signal in units of half periods to generate the plurality of sensing signals, for example, four sensing signals ALC0, ALC0.5, ALC1 and ALC1.5. Then, the sensing circuit 162 maintains the states of the sensing signals by locking the clock signal to be input thereto in response to the conversion completion signal QEN.

Figure 9:
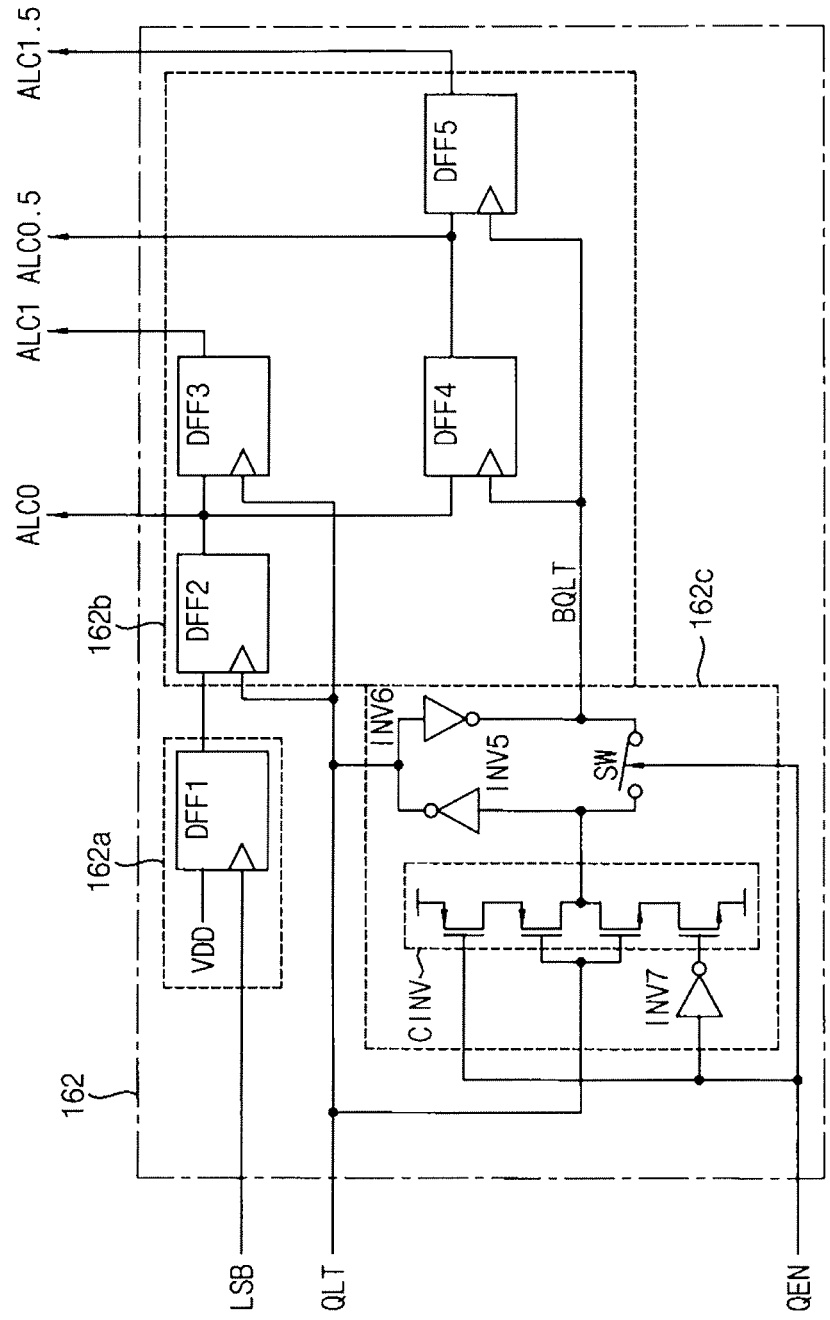
FIG. 9 is a circuit diagram showing the sensing circuit in FIG. 8 according to an exemplary embodiment of the inventive concept.

FIG. 9 is a circuit diagram showing the sensing circuit 162 in FIG. 8 according to an exemplary embodiment of the inventive concept.

Referring to FIG. 9, the sensing circuit 162 includes a set unit 162a, a sensing signal generating circuit 162b, and a latch circuit 162c.

The set unit 162a includes a D flip-flop DFF1. The LSB signal is input to the clock terminal of the D flip-flop DFF1 and VDD is input to the data D terminal of the D flip-flop. Thus, the D flip-flop is synchronized with the time point that the LSB transitions from the low state to the high state (e.g., the rising edge of the $N^{TH}$ clock cycle of VDD), so that the D flip-flop outputs the high state of VDD as the set signal through the positive output terminal.

For example, the sensing signal generating circuit 162b includes four D flip-flops DFF2 to DFF5. The D flip-flops DFF2 and DFF3 output the data inputs, respectively while synchronizing with the rising edge of the clock signal QLT. The data input terminal of the D flip-flop DFF2 is connected to the positive output terminal of the D flip-flop DFF1 and the data input terminal of the D flip-flop DFF3 is connected to the positive output terminal of the D flip-flop DFF2.

The D flip-flops DFF4 and DFF5 output the data inputs in synchronization with the rising edge of the inverted clock signal BQLT through the latch circuit 162c (e.g., the falling edge of the clock signal QLT), respectively. The data input terminal of the D flip-flop DFF4 is connected to the positive output terminal of the D flip-flop DFF2, and the data input terminal of the D flip-flop DFF5 is connected to the positive output terminal of the D flip-flop DFF4.

The positive output of the D flip-flop DFF2 is provided as the first sensing signal ALC0, and is transitioned from the low state to the high state in synchronization with the rising edge of the $(N+1)^{TH}$ clock cycle. The positive output of the D flip-flop DFF3 is provided as the second sensing signal ALC1, and is transitioned from the low state to the high state in synchronization with the rising edge of the $(N+2)^{TH}$ clock cycle. The positive output of the D flip-flop DFF4 is provided as the third sensing signal ALC0.5, and is transitioned from the low state to the high state in synchronization with the falling edge of the $(N+1)^{TH}$ clock cycle. The positive output of the D flip-flop DFF5 is provided as the fourth sensing signal ALC1.5, and is transitioned from the low state to the high state in synchronization with the falling edge of the $(N+2)^{TH}$ clock cycle.

For example, the latch circuit 162c includes CMOS inverters INV5, INV6, and INV7, a switch SW, and a control inverter CINV.

The CMOS inverters INV5 and INV6 are connected in a CMOS latch structure to each other. The switch SW is connected between the input terminal of the CMOS inverter INV5 and the output terminal of the CMOS inverter INV6. The switch SW is switched in response to the conversion completion signal QEN. The clock signal QLT is input to the input terminal of the control inverter CINV and the output terminal of the control inverter CINV is connected to the input terminal of the CMOS inverter INV5. The conversion completion signal QEN is applied to the pull-up control terminal of the control inverter CINV and to the pull-down control terminal of the control inverter CINV through the CMOS inverter INV7.

Therefore, the latch circuit 162c is operated as a CMOS inverter and the switch SW is maintained in a turn-off state while the control inverter CINV is controlled in an active state in the conversion operation section. Thus, the clock signal QLT is applied to the clock terminals of the D flip-flops DFF2 to DFF5. If the state of the conversion completion signal QEN is transitioned from the low state to the high state, since the control inverter CINV is controlled to be in a locking state and the switch is turned on, the CMOS inverters INV5 and INV6 are operated as a latch so that the clock signal line is fixed in one state. Therefore, even though the clock signal QLT is applied to the clock terminals of the D flip-flops DFF2 to DFF5, since the clock signal QLT is locked by the latch circuit 162c, the clock signal is not applied to the clock terminals of the D flip-flops DFF2 to DFF5. The first to fourth sensing signals ALC0, ALC0.5, ALC1 and ALC1.5 output from the D flip-flops DFF2 to DFF5 are maintained in the states at the conversion completion time point.

Referring to FIG. 8 the mode determination unit 164 inputs the first to fourth sensing signals ALC0, ALC0.5, ALC1 and ALC1.5 in synchronization with the conversion completion signal QEN. The mode determination unit 164 combines the states of the four sensing signals to determine a control mode as shown in following Table 1, and outputs the coarse clock signal CCK and the fine clock signal FCK.

TABLE 1

| | Calibration mode | | | | | |
|---|---|---|---|---|---|---|
| Clock Number | ALC0 | ALC 0.5 | ALC1 | ALC 1.5 | ZONE | Mode |
| N − 1 | L | L | L | L | COARSE | Coarse decreasing mode |
| N | H | L | L | L | FINE | Fine decreasing mode |
| N + 0.5 | H | H | L | L | LOCK | Locking mode |
| N + 1 | H | H | H | L | FINE | Fine increasing mode |
| N + 1.5 | H | H | H | H | COARSE | Coarse increasing mode |

The control signal generating circuit 166 includes a bidirectional shift register 166a for generating the coarse control signal CTS and a bidirectional shift register 166b for generating the fine control signal FTS.

The bidirectional shift register 166a determines a shift direction in order to control the different state of the half period or more by inputting the sensing signals ALC0 to ALC1.5, and shifts the initial value in the right or left direction in response to the coarse clock signal CCK so that the coarse control signal CTS, one of the coarse control signals CTS1 to CTS5 of which has logic "1" and the other signals have logic "0", is output.

For example, the coarse control signal CTS may have "00100" as the initial value. If the sensing signal ALC0 is logic low, because of the state that the cycle number of clocks is sensed as (N−1), "1" of the center position is shifted left every time when the coarse clock signal CCK is input, so that the coarse control signal CTS is changed to "01000". Thus, the coarse delay time is decreased from the initial value 20 to 10. To the contrary, if the sensing signal ALC1.5 is logic high, because of the state that the number of clocks is sensed as (N+1.5), "1" of the center position is shifted right every time when the coarse clock signal CCK is input, so that the coarse control signal CTS is changed to "00010". Thus, the coarse delay time is increased from the initial value 20 to 30.

The bidirectional shift register 166b determines the shift direction in order to control the difference of the half period or less by inputting the sensing signals ALC0.5 to ALC1, and shifts the initial value in the right or left direction in response to the fine clock signal FCK so that the coarse control signal FTS, one of the fine control signals FTS1 to FTS5 of which has logic "1" and the other signals have logic "0", is output.

For example, the fine control signal FTS may have "00100" as the initial value. If the sensing signal ALC0.5 is logic low, because of the state that the number of clocks is sensed as N, "1" of the center position is shifted left every time when the fine clock signal is input, so that the fine control signal FTS is changed into "01000". Thus, the fine delay time is decreased from the initial value 6 to 4. To the contrary, if the sensing signal ALC1 is logic high, because of the state that the number of clocks is sensed as (N+1), "1" of the center position is shifted right every time when the fine clock signal FCK is input, so that the fine control signal FTS is changed into "00010". Thus, the fine delay time is increased from the initial value 6 to 8.

Figure 10:
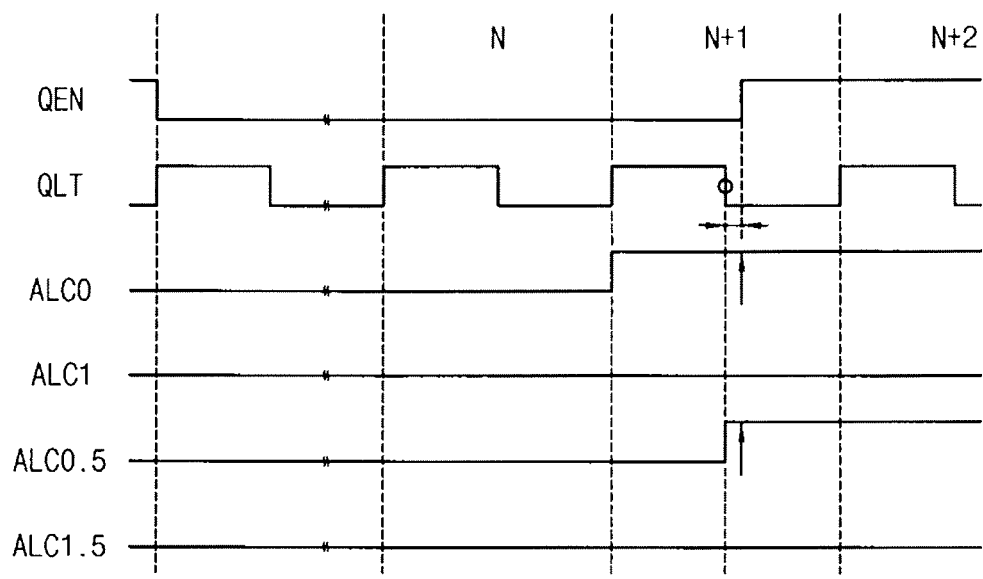
FIG. 10 is an exemplary waveform illustrating a locking mode of the sensing circuit in FIG. 9.
Figure 11:
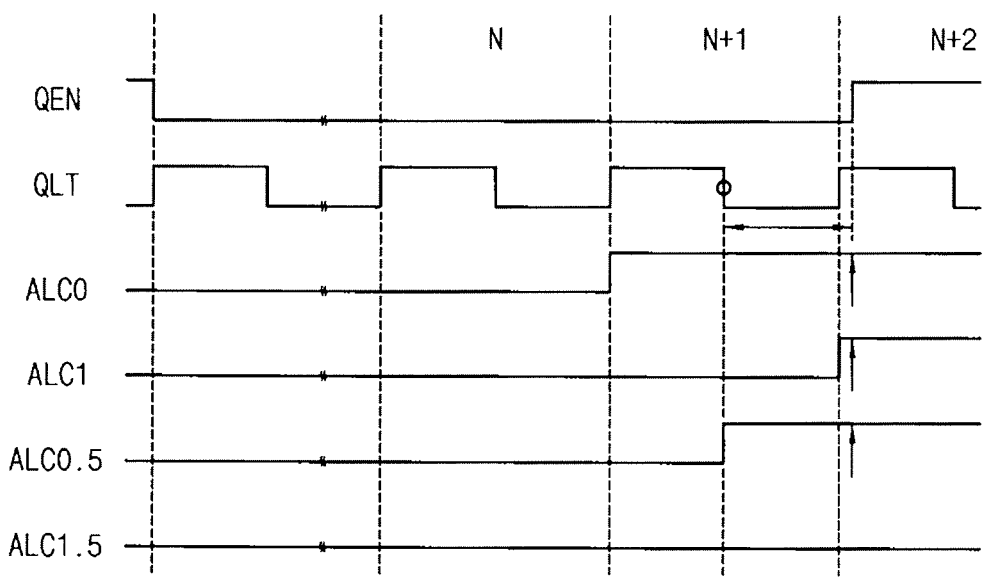
FIG. 11 is an exemplary waveform illustrating a delay time increasing fine control mode of the sensing circuit in FIG. 9.
Figure 12:
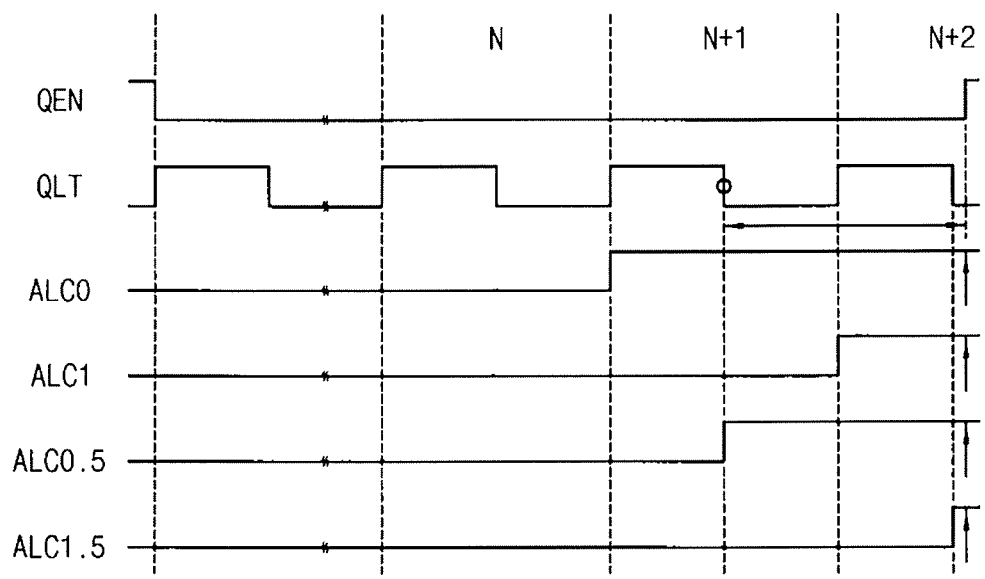
FIG. 12 is an exemplary waveform illustrating a delay time increasing coarse control mode of the sensing circuit in FIG. 9.
Figure 13:
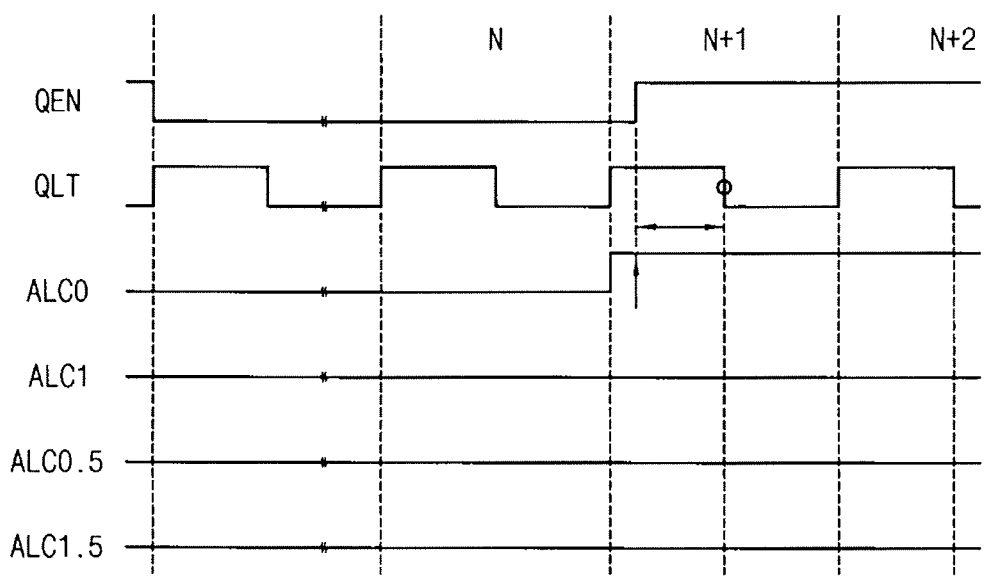
FIG. 13 is an exemplary waveform illustrating a delay time decreasing fine control mode of the sensing circuit in FIG. 9.
Figure 14:
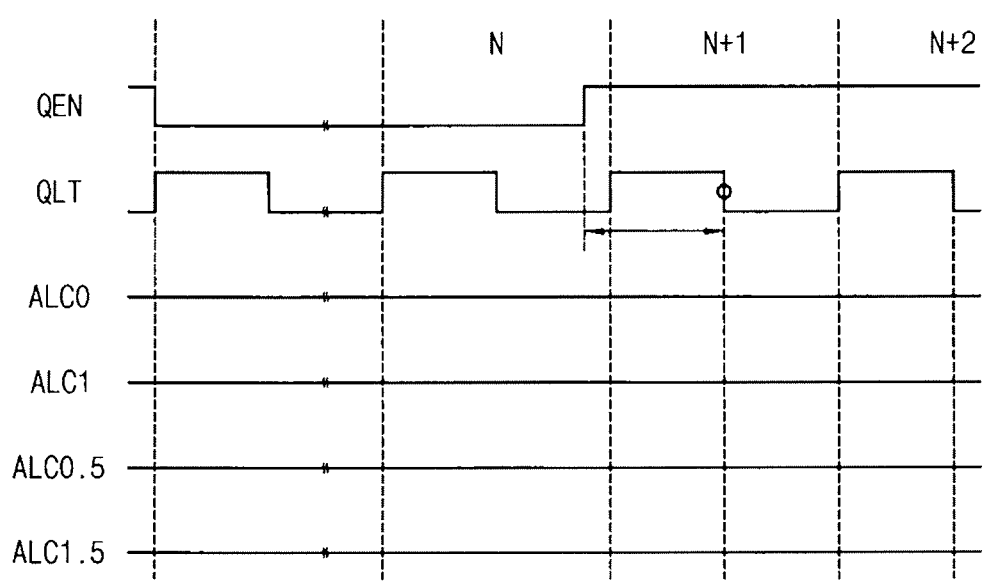
FIG. 14 is an exemplary waveform illustrating a delay time decreasing coarse control mode of the sensing circuit in FIG. 9.

FIG. 10 is an exemplary waveform illustrating a locking mode of the sensing circuit in FIG. 9. FIG. 11 is an exemplary waveform illustrating a delay time increasing fine control mode of the sensing circuit in FIG. 9. FIG. 12 is an exemplary waveform illustrating a delay time increasing coarse control mode of the sensing circuit in FIG. 9. FIG. 13 is an exemplary waveform illustrating a delay time decreasing fine control mode of the sensing circuit in FIG. 9. FIG. 14 is an exemplary waveform illustrating a delay time decreasing type coarse control mode of the sensing circuit in FIG. 9.

Referring to FIG. 10, since the input of the clock signal QLT to the sensing circuit 162 is locked at the rising edge of the conversion completion signal QEN after the sensing signal ALC0 is transitioned to the high state at the $(N+1)^{TH}$ rising edge of the clock signal QLT and the sensing signal ALC0.5 is transitioned to the high state at the $(N+1)^{TH}$ falling edge, the sensing signals ALC1 and ALC1.5 are maintained in the low state. Thus, since the (N+0.5) cycle of the clock signal is matched during the conversion operation section, the previous delay time is locked.

Referring to FIG. 11, since the input of the clock signal QLT to the sensing circuit 162 is locked at the rising edge of the conversion completion signal QEN after the sensing signal ALC0 is transitioned to the high state at the $(N+1)^{TH}$ rising edge of the clock signal QLT, the sensing signal ALC0.5 is transitioned to the high state at the $(N+1)^{TH}$ falling edge, and the sensing signal ALC1 is transitioned to the high state at the $(N+2)^{TH}$ rising edge, and the sensing signal ALC1.5 is maintained in the low state. Thus, the (N+1) clock cycle is sensed during the conversion operation section, which signifies that the delay time is reduced due to, for example, a process variable, a temperature variation or a power source voltage variation. Therefore, the mode determination unit 164 determines the delay time increasing type fine control mode in order to increase the delay time and generates the incremental fine control signal through the control signal generating circuit 166, so that the delay time of the delay block 154 is finely controlled. Thus, the clock signal QLT is generated according to the finely increased delay time during the next conversion operation cycle.

Referring to FIG. 12, the input of the clock signal QLT to the sensing circuit 162 is locked at the rising edge of the conversion completion signal QEN after the sensing signal ALC0 is transitioned to the high state at the $(N+1)^{TH}$ rising edge of the clock signal QLT, the sensing signal ALC0.5 is transitioned to the high state at the $(N+1)^{TH}$ falling edge, and the sensing signal ALC1.5 is transitioned to the high state at the $(N+2)^{TH}$ falling edge. Thus, the (N+1.5) clock cycle is sensed during the conversion operation section, which may signify that the delay time is reduced due to a process variable, a temperature variation or a power source voltage variation. Therefore, the mode determination unit 164 determines the delay time increasing type coarse control mode in order to increase the delay time and generates the incremental coarse control signal through the control signal generating circuit 166, so that the delay time of the delay block 154 is coarsely controlled. Thus, the clock signal QLT is generated according to the coarsely increased delay time during the next conversion operation cycle.

Referring to FIG. 13, since the input of the clock signal QLT to the sensing circuit 162 is locked at the rising edge of the conversion completion signal QEN after the sensing signal ALC0 is transitioned to the high state at the $(N+1)^{TH}$ rising edge of the clock signal QLT, the sensing signals ALC0.5, ALC1 and ALC1.5 are maintained in the low state. Thus, the N clock cycles are sensed during the conversion operation section, which may signify that the previous delay time is increased due to a process variable, a temperature variation or a power source voltage variation. Therefore, the mode determination unit 164 determines the delay time decreasing type fine control mode in order to decrease the delay time and generates the decremental fine control signal through the control signal generating circuit 166, so that the delay time of the delay block 154 is finely controlled. Thus, the clock signal QLT is generated according to the finely decreased delay time during the next conversion operation cycle.

Referring to FIG. 14, since the input of the clock signal QLT to the sensing circuit 162 is locked at the rising edge of the conversion completion signal QEN before the high state at the $(N+1)^{TH}$ rising edge of the clock signal QLT, the sensing signals ALC0, ALC0.5, ALC1 and ALC1.5 all are maintained in the low state. Thus, the (N−1) clock cycle is sensed during the conversion operation section, which may signify that the previous delay time is increased due to a process variable, a temperature variation or a power source voltage variation. Therefore, the mode determination unit 164 determines the decreasing type coarse control mode in order to decrease the delay time and generates the decremental coarse control signal through the control signal generating circuit 166, so that the delay time of the delay block 154 is coarsely controlled.

Thus, the clock signal QLT is generated according to the coarsely decreased delay time during the next conversion operation cycle.

Figure 15:
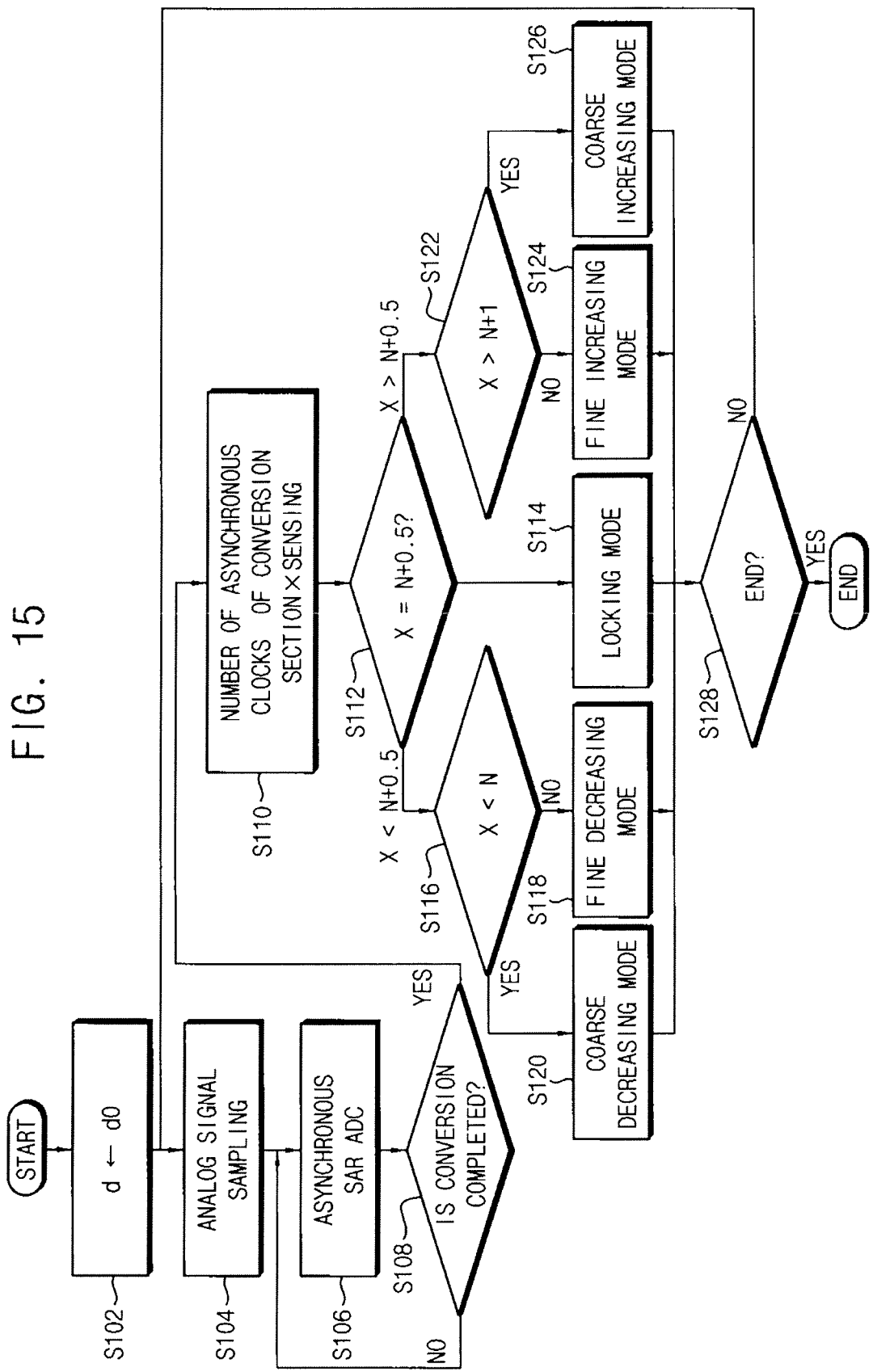
FIG. 15 is a flowchart illustrating a converting method according to an exemplary embodiment of the inventive concept.

FIG. 15 is a flowchart illustrating a converting method according to an exemplary embodiment of the inventive concept.

Referring to FIG. 15, the method of converting an analog signal into N-bit digital data according to an exemplary embodiment of the inventive concept first resets the delay time of the clock signal QLT into an initiate value d0 (S102). Then, the analog signal is sampled (S104). Next, the sampled analog signal is compared with a reference signal successively varied every period of the clock signal QLT such that the analog signal is converted into the digital data (S106). For example, the binary signal approximated to the result of the comparing step is successively searched from the most significant bit to the least significant bit, and then, the N-bit digital data including the searched binary signal are successively generated. Thus, the generated N-bit digital data are analog-converted to generate the reference signal for the comparing step.

Next, it is determined whether the digital data conversion by the successive approximation conversion has completed (S108). When the conversion has completed, the number X of clock cycles used for the conversion operation process is sensed (S110).

It is determined whether the number X of sensed clock cycles is equal to (N+0.5), less than (N+0.5), or greater than (N+0.5) (S112). If the number X of sensed clock cycles is equal to (N+0.5), the locking mode is performed (S114) so that the delay time of the clock signal is maintained at the initial value.

If the number X of sensed clock cycles is less than (N+0.5), it is determined whether the number X is less than N (S116). If the number X is not less than N, it is determined that the period of the clock signal is slightly increased, so that the fine decreasing mode is performed (S118) such that the delay time of the clock signal can be slightly reduced more than the previous value in order to allow the slight increased period to return to the original clock period.

If the number X of the sensed clock cycles is less than the N, it is determined that the period of the clock signal is greatly increased, so that the coarse decreasing mode is performed (S120) such that the delay time of the clock signal can be greatly reduced more than the previous value in order to allow the slight increased period to return to the original clock period.

If the number X of sensed clock cycles is greater than (N+0.5), it is determined whether the number X is greater than (N+1) (S122). If the number X is not greater than (N+1), it is determined that the period of the clock signal is slightly reduced, so that the fine increasing mode is performed (S124) such that the delay time of the clock signal can be greatly increased more than the previous value in order to allow the slight decreased period to return to the original clock period.

If the number X of the sensed clock cycles is greater than the (N+1), it is determined that the period of the clock signal is greatly reduced, so that the coarse increasing mode is performed (S126) such that the delay time of the clock signal can be greatly increased more than the previous value in order to allow the slight decreased period to return to the original clock period.

After controlling the delay time in steps S114, S118, S120, S124 and S126, it is identified whether the system has completed (S128). If not completed, the analog signal sampling is performed (S104).

Figure 16:
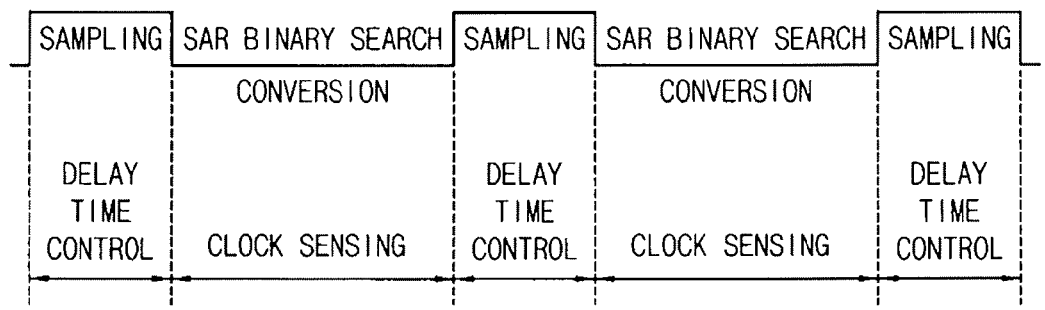
FIG. 16 is a view illustrating a relationship between a process of an analog-to-digital converting operation and a background calibration operation according to an exemplary embodiment of the inventive concept.

As shown in FIG. 16, according to an exemplary embodiment, the control of the delay time has completed during the sampling section and the sensing of the cycle number of the clock signal has completed during the conversion operation section. Thus, the period variation of the clock signal is checked every conversion cycle and the delay time is automatically controlled such that the cycle number of the clock signal used during the conversion operation section follows the (N+0.5).

Although a limited numbers of control steps, bidirectional shift registers, flip-flops and logical circuits are illustrated in the above figures for the purpose of convenient description of the analog-to-digital converting apparatus according to exemplary embodiments of the inventive concept, it should be understood that the number of control steps, flip-flops and logical circuits can be increased and decreased in alternate embodiments.

The foregoing is illustrative of exemplary embodiments of the inventive concept and is not to be construed as limiting thereof. Although a few exemplary embodiments have been described, those skilled in the art will readily appreciate that many modifications are possible in these exemplary embodiments without materially departing from the present inventive concept. Accordingly, all such modifications are intended to be included within the scope of the present inventive concept.

What is claimed is:

1. An apparatus for converting an analog signal into multi-bit digital data, the apparatus comprising:
   a sample holding circuit configured to sample and hold the analog signal;
   a comparator configured to compare the sampled and held analog signal with an analog reference signal in response to a clock signal;
   a digital-to-analog converter configured to convert the multi-bit digital data into the analog reference signal and provide the analog reference signal to the comparator;
   a clock generator configured to generate the clock signal in response to an operation state of the comparator and configured to control a period of the clock signal according to a delay time varied by a control signal;
   a successive approximation logic circuit configured to successively search for a binary signal that is approximated to an output signal of the comparator from a most significant bit to a least significant bit of the binary signal in response to the clock signal and configured to provide the multi-bit digital data resulting from the search to the digital-to-analog converter; and
   a background calibration circuit configured to sense a cycle number of the clock signal used in the comparator and the successive approximation logic circuit at a conversion completion time point and configured to generate the control signal such that a next cycle number of the clock signal to be used for a subsequent converting operation cycle follows an N-th clock cycle of the clock signal.

2. The apparatus of claim 1, wherein the clock generator comprises:
   an input unit configured to generate an operation state signal in response to the output signal of the comparator;
   a delay block configured to delay the operation state signal in response to the control signal from the background calibration circuit; and
   an output unit configured to output a signal delayed through the delay block as the clock signal, in response to a conversion start signal.

3. The apparatus of claim 2, wherein the control signal comprises a fine control signal and a coarse control signal, and
wherein the delay block comprises a fine tuning circuit operating in response to the fine control signal and a coarse tuning circuit operating in response to the coarse control signal.

4. The apparatus of claim 3, wherein the fine tuning circuit comprises:
two complementary metal-oxide semiconductor (CMOS) inverters cascade-coupled between the input unit and the coarse tuning circuit; and
two variable current sources serially connected to each drain current path of the two CMOS invertors, the two variable current sources having set current values that are varied in response to the fine control signal.

5. The apparatus of claim 4, wherein each of the two variable current sources comprises:
a plurality of fine control switches connected in parallel to each other, the fine control switches configured to be switched selectively in response to the fine control signal; and
a plurality of fixed current sources serially connected to each of the fine control switches, the fixed current sources having fixed set current values different from each other.

6. The apparatus of claim 3, wherein the coarse tuning circuit comprises:
a plurality of CMOS delay cells of a fixed-current type, the CMOS delay cells cascade-coupled between the fine tuning circuit and the output unit; and
a plurality of coarse control switches, each coarse control switch connected between the output unit and an output terminal of each CMOS delay cell, the coarse control switches configured to be switched selectively in response to the coarse control signal.

7. The apparatus of claim 1, wherein the background calibration circuit comprises:
a sensing circuit configured to sense the cycle number of the clock signal at the conversion completion time point;
a mode determination unit configured to determine a control mode in response to the sensed cycle number; and
a control signal generating circuit configured to generate the control signal in response to the determined control mode and the sensed cycle number.

8. The apparatus of claim 7, wherein the sensing circuit comprises:
a set unit configured to be set in response to a least significant bit from the successive approximation logic circuit;
a sensing signal generating circuit configured to receive a set value of the set unit and configured to generate a plurality of sensing signals corresponding to the cycle number; and
a latch circuit configured to lock the clock signal applied to the sensing signal generating circuit at the conversion completion time point.

9. The apparatus of claim 8, wherein the mode determination unit determines a locking mode, a fine control mode or a coarse control mode according to the cycle number of the clock signal, the cycle number corresponding to a combination of the sensing signals, generates a fine clock signal in the fine control mode and generates a coarse clock signal in the coarse control mode.

10. The apparatus of claim 9, wherein the control signal generating circuit comprises:
a first bidirectional shift register configured to determine a shift direction in response to the sensing signals and configured to generate a fine control signal which is shifted in the determined shift direction in response to the fine clock signal; and
a second bidirectional shift register configured to determine a shift direction in response to the sensing signals and configured to generate a coarse control signal which is shifted in the determined shift direction in response to the coarse clock signal.

11. A method of converting an analog signal into multi-bit digital data, the method comprising:
comparing the analog signal with an analog reference signal that is successively varied per period of a clock signal;
successively searching for a binary signal that is approximated to a result of the comparing from a most significant bit to a least significant bit of the binary signal to successively generate the multi-bit digital data;
generating the analog reference signal by converting the multi-bit digital;
sensing a cycle number of the clock signal at a conversion completion time point;
generating the clock signal in response to the result of the comparing; and
controlling a delay time of the clock signal such that a next cycle number of the clock signal to be used for a subsequent converting operation cycle follows an N-th clock cycle of the clock signal.

12. The method of claim 11, wherein sensing the cycle number comprises:
setting a set value in response to a least significant resulting from searching for the binary signal;
generating a plurality of sensing signals in response to the clock signal and the set value, the sensing signals being set per half period of the clock signal from an (N+1)th clock cycle of the clock signal; and
locking the clock signal at the conversion completion time point.

13. The method of claim 12, wherein controlling the delay time comprises:
determining a control mode in response to the sensed cycle number;
generating a control signal in response to determined control mode; and
changing the delay time of the clock signal in response to the control signal.

14. The method of claim 13, wherein determining the control mode comprises:
determining a locking mode, a fine control mode or a coarse control mode, respectively, according to the cycle number of the clock signal, the cycle number being sensed based on a combination of the sensing signals;
generating a fine clock signal in the fine control mode; and
generating a coarse clock signal in the coarse control mode.

15. The method of claim 13, wherein generating the control signal comprises:
determining a direction changing the delay time in response to the sensing signals;
generating a fine control signal that is shifted in the determined direction in response to the fine clock signal when the sensed cycle number of the clock signal is within a half cycle in comparison with an N-th cycle of the clock signal; and
generating a coarse control signal that is shifted in the determined direction in response to the coarse clock signal when the sensed cycle number of the clock signal is outside of the half cycle in comparison with the N-th cycle.

16. An apparatus for converting an analog signal into multi-bit digital data, the apparatus comprising:
- a comparator configured to compare the analog signal with an analog reference signal in response to a clock signal;
- a digital-to-analog converter configured to convert the multi-bit digital data into the analog reference signal and provide the analog reference signal to the comparator;
- a clock generator configured to control a period of the clock signal according to a delay time varied by a control signal;
- a successive approximation logic circuit configured to perform a conversion operation on an output signal of the comparator in response to the clock signal to generate the multi-bit digital signal for output to the digital-to-analog converter; and
- a background calibration circuit configured to determine a number of clock cycles of the clock signal taken to perform the operation based on a least significant bit (LSB) of a signal generated by the logic circuit during the operation, and generate the control signal based on the determined number.

17. The apparatus of claim 16, wherein the successive approximation logic circuit is a successive approximation register analog-to-digital converter.

18. The apparatus of claim 16, wherein the background calibration circuit determines the number of clock cycles based on the LSB, the clock signal, and a signal indicating the conversion has completed.

19. The apparatus of claim 18, wherein the background calibration circuit maintains the delay time when the determined number is a sum of a predetermined integer+0.5, decreases the delay time when the determined number is less than the sum, and increases the delay time when the determined number is greater than the sum.

20. The apparatus of claim 19, wherein the background calibration circuit decreases the delay time a first value when the sum is less than the integer and otherwise decreases the delay time a second value smaller than the first value, and wherein the background calibration circuit increases the delay time a third value when the sum is greater than a sum of the integer and one and otherwise increases the delay time a fourth value smaller than the third value.

* * * * *